United States Patent [19]

Kwong et al.

[11] Patent Number: 5,347,484
[45] Date of Patent: Sep. 13, 1994

[54] NONVOLATILE MEMORY WITH BLOCKED REDUNDANT COLUMNS AND CORRESPONDING CONTENT ADDRESSABLE MEMORY SETS

[75] Inventors: Phillip M. Kwong; Sachidanandan Sambandan, both of Folsom; Sherif R. B. Sweha, El Dorado Hills; Duane R. Mills, Folsom, all of Calif.

[73] Assignee: Intel Corporation, Santa Clara, Calif.

[21] Appl. No.: 216,766

[22] Filed: Mar. 23, 1994

Related U.S. Application Data

[63] Continuation of Ser. No. 901,387, Jun. 19, 1992, abandoned.

[51] Int. Cl.$^5$ ............................................. G11C 11/40
[52] U.S. Cl. .............................. 365/49; 365/230.03; 365/200; 365/230.02
[58] Field of Search .................... 365/49, 200, 230.01, 365/230.02, 230.03, 49

[56] References Cited

U.S. PATENT DOCUMENTS

| | | | |
|---|---|---|---|
| 4,601,019 | 7/1986 | Shah et al. | 365/200 |
| 4,807,191 | 2/1989 | Flannagan | 365/200 |
| 5,031,142 | 7/1991 | Castro | 365/200 |
| 5,065,364 | 11/1991 | Atwood et al. | |
| 5,083,294 | 1/1992 | Okajima | 365/200 |
| 5,233,559 | 8/1993 | Brennan, Jr. | 365/200 |

OTHER PUBLICATIONS

Fitzgerald et al, "Memory System With High-Performance Word Redundancy", IBM TDB, vol. 19, No. 5, Oct. 1976 pp. 1638–1639.

Primary Examiner—Viet Q. Nguyen
Attorney, Agent, or Firm—Blakely, Sokoloff, Taylor & Zafman

[57] ABSTRACT

A nonvolatile memory device is described. The memory device includes a main memory array for storing data. The main memory array comprises a first block and a second block. A redundant memory array comprises a first redundant block and a second redundant block. The first redundant block comprises a first redundant column of memory cells and a second redundant column of memory cells. The second redundant block comprises a third redundant column of memory cells and a fourth redundant column of memory cells. A content addressable memory (CAM) comprises a first set of CAM cells for storing a first address of a first defective column in the main memory array and a second set of CAM cells for storing a second address of a second defective column in the main memory array. The first set of CAM cells cause the first redundant column in the first redundant block to replace the first defective column when the first defective column is in the first block. The first set of CAM cells cause the third redundant column in the second redundant block to replace the first defective column when the first defective column is in the second block. The second set of CAM cells cause the second redundant column in the first redundant block to replace the second defective column when the second defective column is in the first block. The second set of CAM cells cause the fourth redundant column in the second redundant block to replace the second defective column when the second defective column is in the second block.

19 Claims, 3 Drawing Sheets

NONVOLATILE MEMORY WITH BLOCKED REDUNDANT COLUMNS AND CORRESPONDING CONTENT ADDRESSABLE MEMORY SETS

This is a continuation of application. Ser. No. 07/901,387, filed Jun. 19, 1992, abandoned.

FIELD OF THE INVENTION

The present invention pertains to the field of computer memories. More particularly, this invention relates to a nonvolatile memory with content addressable memory ("CAM") sets and redundant memory blocks, wherein each CAM set can activate one column of redundant memory cells of one redundant memory block to replace any one defective column of memory cells in an associative main memory block.

BACKGROUND OF THE INVENTION

Metal-oxide-semiconductor ("MOS") electrically programmable read-only memories ("EPROMs") frequently use memory cells that have electrically isolated gates which are referred to as floating gates. Information is stored in the memory cells in the form of charge on the floating gates.

One type of prior EPROM is the flash erasable and electrically programmable read-only memory ("flash EPROM"). The flash EPROM can be programmed by a user, and once programmed, the flash EPROM retains its data until erased. Once programmed, the contents of flash EPROM can be erased by electrical erasure. The flash EPROM may then be reprogrammed with new codes or data.

One type of prior flash EPROM typically includes redundant memory cells and CAM cells in addition to a main memory array. The redundant memory cells are used to replace defective cells of the main memory array. The redundant memory cells are also arranged into rows and columns and are therefore referred to as redundant memory array. When a memory cell in a column of the main memory array is found defective, a redundant column of the redundant memory array is used to replace the defective column in the main memory array.

The CAM cells are typically used to activate the redundant memory array to replace any defective columns of the main memory array. The CAM cells typically comprise flash EPROM cells. The CAM cells are typically arranged into groups in order to be programmed to store addresses of the defective memory columns of the main memory array. The grouped CAM cells are therefore referred to as CAM sets.

A typical prior arrangement of using the redundant memory columns and the CAM sets to replace defective columns in the main memory array employs a number of the CAM sets, each associated with one redundant column so that all the redundant columns can be accessed. When a defective column in the main memory array is discovered, a redundant column is activated to replace the defective column. This is done by storing the address of the defective column in a CAM set associated with the redundant column. A comparison with the stored address is made every time the prior flash EPROM is addressed to determine whether a cell in the defective column is addressed. If so, the redundant column associated with the CAM set is activated for the read, programming, or erasing operation of the defective column. If not, the redundant column associated with the CAM set is not activated.

Disadvantages are, however, associated with the prior arrangement. One disadvantage associated is that the prior arrangement typically requires a large number of CAM sets and therefore a large number of CAM cells to activate a large member of redundant columns. For example, to activate forty redundant columns would require forty sets of CAM cells. The large number of CAM cells typically occupy relatively large space on the memory chip. This either results in an increase in die size of the prior flash EPROM if a predetermined storage capacity is maintained or a decrease in storage capacity of the prior flash EPROM if the die size remains unchanged.

One prior approach to solving the problem is to introduce encoding to reduce the number of the CAM sets. A typical example is to reduce the number of the CAM sets to half the number of the redundant columns. The redundant columns are identified as odd redundant columns and even redundant columns. Accordingly, the columns of the main memory array are also divided into odd columns and even columns. The odd redundant columns can replace odd defective columns of the main memory array and the even redundant columns can replace even defective columns of the main memory array. Each CAM set is associated with one odd redundant column and one even redundant column. Each CAM set activates its associative odd redundant column or its associative even redundant column depending upon the stored address. If the stored address indicates that the defective column in the main memory array is an odd column, then the CAM set activates its associative odd redundant column to replace the odd defective column in the main memory array. If the stored address indicates that the defective column is an even column in the main memory array, then the CAM set activates its associative even redundant column to replace the even defective column in the main memory array.

Disadvantages are associated with such prior approach. One disadvantage associated is that when the main memory array is organized into bit line blocks and the redundant memory array is accordingly organized into redundant blocks, the ability of activating a redundant column in a redundant block to replace a defective column in the associative main block is limited by the odd-to-odd even-to-even encoding. For example, when each of the redundant blocks includes two odd redundant columns and two even redundant columns, only two defective columns in the associative main block can be replaced. When there are three odd or even defective columns in the main block, the third one cannot be replaced even though there are two unused redundant columns in that redundant block and many empty CAM sets.

SUMMARY AND OBJECTS OF THE INVENTION

One of the objects of the present invention is to provide a nonvolatile memory with redundant memory blocks and CAM sets, wherein the number of the CAM sets are minimized without limiting the flexibility of replacing any defective memory columns in the main memory array.

Another object of the present invention is to provide a nonvolatile memory with redundant memory blocks and CAM sets, wherein the number of the CAM sets are minimized while still able to access all redundant memory columns in a redundant block to replace any defective memory columns in its corresponding main memory block.

Another object of the present invention is to provide a nonvolatile memory that is organized in blocks and with redundant memory blocks and CAM sets, wherein the number of the redundant blocks corresponds to the number of main blocks and the number of the CAM sets corresponds to the number of redundant columns within one redundant block.

A nonvolatile memory device is described. The memory device includes a main memory array for storing data. The main memory array comprises a first block and a second block. A redundant memory array comprises a first redundant block and a second redundant block. The first redundant block comprises a first redundant column of memory cells and a second redundant column of memory cells. The second redundant block comprises a third redundant column of memory cells and a fourth redundant column of memory cells. A content addressable memory (CAM) comprises a first set of CAM cells for storing a first address of a first defective column in the main memory array and a second set of CAM cells for storing a second address of a second defective column in the main memory array. The first set of CAM cells cause the first redundant column in the first redundant block to replace the first defective column when the first defective column is in the first block. The first set of CAM cells cause the third redundant column in the second redundant block to replace the first defective column when the first defective column is in the second block. The second set of CAM cells cause the second redundant column in the first redundant block to replace the second defective column when the second defective column is in the first block. The second set of CAM cells cause the fourth redundant column in the second redundant block to replace the second defective column when the second defective column is in the second block.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
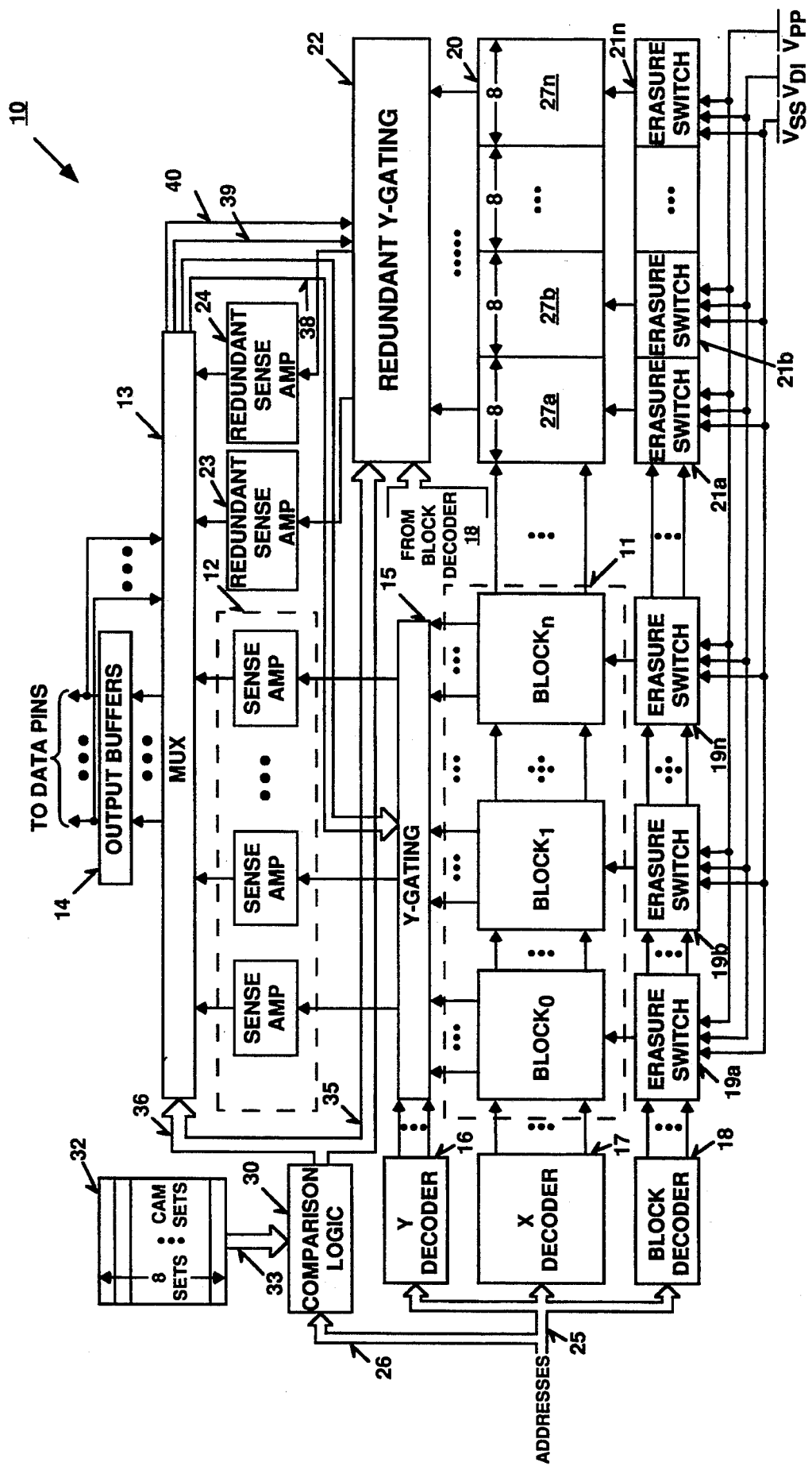
FIG. 1 is a block diagram of the layout of a flash EPROM, including CAM sets, comparison logic, multiplexers, redundant memory blocks, and redundant Y gating circuitry.

FIG. 1 illustrates in block diagram form the layout of a flash EPROM 10, which implements a preferred embodiment of the present invention. Flash EPROM 10 includes a main memory array 11 that is organized into a plurality of blocks BLOCK0 through BLOCKn. Main memory array 11 is made up of electrically erasable read-only memory cells that store data at addresses. For one embodiment, main memory array 11 can store 4 Mbits ("megabits") of data. For alternative embodiments, main memory array 11 can store more or fewer than 4 Mbits of data.

For one embodiment, all circuitry of flash EPROM 10 resides on a single substrate. For a further embodiment, flash EPROM 10 employs CMOS circuitry.

As described in more detail below, blocks BLOCK0 through BLOCKn of the main memory array of flash EPROM 10 are organized as bit line blocks. Each block includes a plurality of columns of memory cells. A redundant memory array is also organized into a plurality of redundant blocks, each having a plurality of redundant memory columns. Each redundant column in each redundant block can replace one defective column of memory cells in a corresponding block of the main memory array.

A plurality of CAM sets are provided for storing addresses of defective columns in the main memory array. Each CAM set activates one redundant column in one redundant block to replace one defective column of memory cells in an associative main block. The number of redundant blocks corresponds to the number of the blocks of the main memory array. The number of redundant columns within one redundant block corresponds to the number of the CAM sets. The CAM sets can access all redundant columns in the redundant memory array to replace any defective columns in the main memory array without any level of encoding.

Referring to FIG. 1, blocks BLOCK0 through BLOCKn are grouped into bit line blocks. Each block includes a plurality of bit lines. The bit lines of a block are thus constructed to extend only within that block and are not connected to any cells in its adjacent blocks. The bit lines from each of blocks BLOCK0-BLOCKn are selectively coupled to main sense amplifiers 12 via a Y gating circuitry 15. Y gating circuitry 15 includes a plurality of column select transistors coupled to the bit lines from blocks BLOCK0-BLOCKn. The outputs of main sense amplifiers 12 are then coupled to output buffers 14 via a multiplexer 13. Sense amplifiers 12 include a plurality of sense amplifiers. Output buffers 14 include a plurality of output buffers.

For one embodiment, flash EPROM 10 includes sixteen data pins $D_0$ through $D_{15}$ (i.e., word wide). For this embodiment, sense amplifiers 12 include sixteen sense amplifiers and output buffers 14 include sixteen buffers, each corresponding to one of data pins $D_0$–$D_{15}$. For another embodiment, flash EPROM 10 includes eight data pins $D_0$ through $D_7$ (i.e., byte wide). For this embodiment, sense amplifiers 12 include eight sense amplifiers and output buffers 14 include eight buffers.

Main memory array 11 also includes a plurality of word lines. The word lines, unlike the bit lines, are shared by and are common to all blocks. The memory cells of each block are formed at intersections of word lines and bit lines. The memory cells within each block have their control gates coupled to the word lines. The drains of the memory cells within one block are connected to the bit lines of that block. The sources of all memory cells within one block are connected to a common source line of that block.

Flash EPROM 10 includes a boot block and two parameter blocks that reside within one of the blocks BLOCK0-BLOCKn. The boot block stores, for example, program codes for system initialization reprogramming algorithms. The boot block typically requires the least amount of update in flash EPROM 10. The parameter blocks are provided to allow the user to store frequently updated system parameters and configuration information.

Flash EPROM 10 also includes a first group of erasure switches 19a through 19n, each associated with one of blocks of BLOCK0–BLOCKn. Each of erasure switches 19a–19n couples one of a ground potential $V_{SS}$, a disturb inhibit potential $V_{DI}$, and a programming/erasure potential $V_{PP}$ to the sources of all cells within its respective block during one of read, programming, and erasure operations via a common source line. Each of erasure switches 19a–19n may be ordinary switch that comprises a set of FET transistors.

Flash EPROM 10 includes an X decoder 17, a Y decoder 16, and a block decoder 18. X decoder 17 is the row decoder for memory array 11. Y decoder 16 is the column decoder for memory array 11. Block decoder 18 is the block selector for memory array 11. Addresses are applied to decoders 16–18 via address bus 25.

X decoder 17 is coupled to word lines of memory array 11. X decoder 17 receives X addresses from address bus 25. X decoder selects one word line in accordance with each of the X addresses applied via bus 25 in one of read and programming operations. X decoder 17 may be any ordinary decoder available.

Y decoder 16 is coupled, via Y gating circuitry 15, to the bit lines of each of blocks of BLOCK0–BLOCKn of memory array 11. Y decoder 16 receives Y addresses from address bus 25. Y decoder 16 selects one byte of bit lines (i.e., 8 lines) or one word of bit lines (i.e., 16 lines) within a block to undergo read or programming operation for every Y address applied. For any given Y address, only one block is a selected block in flash EPROM 10. Y decoder 16 causes Y gating circuitry 15 to connect the selected bit lines in the selected block to sense amplifiers 12 in the read operation. Y decoder 16 also causes Y gating circuitry 15 to connect the selected bit lines in the selected block to receive data for programming from the data pins of flash EPROM 10 via multiplexer 13 and bus 38. Y decoder 16 can be any ordinary decoder.

For one embodiment, Y decoder 16 selects one byte of bit lines for every Y address applied. For another embodiment, Y decoder 16 selects one word (i.e., two bytes) of bit lines for every Y address applied.

Block decoder 18 is coupled to erasure switches 19a through 19n. Block decoder 18 also receives Y addresses from address bus 25. Block decoder 18 selects one of blocks BLOCK0–BLOCKn by selecting the associative one of erasure switches 19a–19n for any given Y address applied. Again, for any given Y address, only one block is a selected block. Given that each of blocks BLOCK0 through BLOCKn only has one common source line coupled to the sources of all memory cells within a block, only a subset of the Y address is required by block decoder 18 to determine which block is the selected block and conversely which blocks are not selected. Thus, block decoder 18 may be an intermediate decoding stage of Y decoder 16 used for selecting the bit lines from blocks BLOCK0–BLOCKn. It can also be true that block decoder 18 is a separate decoder.

Block decoder 18 selects one of erasure switches 19a–19n to couple one of the $V_{SS}$, $V_{PP}$, and $V_{DI}$ potentials to the selected block and one of the $V_{SS}$, $V_{PP}$, and $V_{DI}$ potentials to the unselected blocks during one of read, programming, and erasure operations, which will be described below, in connection with the description of each of the read, programming, and erasure operations.

For one embodiment, $V_{PP}$ is approximately 12 volts and $V_{DI}$ is approximately 3.5 volts. For another embodiment, $V_{DI}$ is approximately 2 volts. The purpose of having the disturb inhibit potential is to apply the $V_{DI}$ potential to the sources of memory cells in unselected blocks, during programming, to prevent the cells along a selected word line in the unselected blocks from being programmed. The $V_{DI}$ potential is low enough to prevent erasing of memory cells along unselected word lines in unselected blocks and yet high enough to prevent programming of cells along the selected word line of the unselected blocks.

Initially, the entire flash EPROM 10 of FIG. 1 is erased before being programmed to store data at addresses. After initial programming, flash EPROM 10 can be read, erased and reprogrammed. It is expected that one block or blocks of main memory array 11 may be selected for reprogramming after initial programming. Only the block or blocks requiring reprogramming are erased and reprogrammed. The read, programming, and erasure operations of main memory array 11 will be described below.

During the read operation of flash EPROM 10, X decoder 17 receives an X address to select one word line. Y decoder 16 receives a Y address via bus 25 to select one byte or one word of bit lines from one of blocks BLOCK0 through BLOCKn via Y gating circuitry 15. The selected bit lines each is connected to one of sense amplifiers 12 via Y gating circuitry 15. Block decoder 18 also receives the Y address via bus 25 to select the erasure switch associated with the selected block to couple the $V_{SS}$ potential to the sources of all the cells of the selected block. Memory cells at the intersection of the selected word line and the selected bit lines are the selected cells. A read voltage of approximately 5 volts is maintained on the selected word line. A potential of approximately one volt is maintained on the selected bit lines. Sense amplifiers 12 then read out the data stored in the selected cells via the selected bit lines. Whether a selected cell stores a "zero" or "one" bit information is determined by the conductivity of the cell. Sense amplifiers 12 then apply the data read from the selected cells to output buffers 14 via multiplexer 13.

During the programming operation of flash EPROM 10, X decoder 17 receives an X address to select a word line. Y decoder 16 receives a Y address to select one byte or one word of bit lines in one of blocks of BLOCK0–BLOCKn via Y gating circuitry 15. Block decoder 18 also receives the Y address to select the erasure switch associated with the selected block. The programming potential $V_{PP}$ is applied to the selected word line and a programming potential $V_P$ is selectively applied to the selected bit lines. Whether the $V_P$ potential is applied to a particular selected bit line depends on the data to be programmed. The data to be programmed is applied to the selected bit lines via the data pins of flash EPROM 10, multiplexer 13, and bus 38 and via Y gating circuitry 15. For one embodiment, the $V_P$ potential is approximately 7 volts.

Meanwhile, the selected erasure switch for the selected block couples the $V_{SS}$ ground potential to the sources of the cells in the selected block and the erasure switches for the unselected blocks couple the $V_{DI}$ disturb inhibit potential to the sources of the memory cells in all unselected blocks. In this way, disturbance from the programming of the selected memory cells along the selected word line in the selected block to the memory cells along the selected word line in all unselected blocks is therefore prevented.

During the block erasure operation, block decoder 18 receives a bock address (i.e., Y address) to select a erasure switch. The selected erasure switch then couples the erasure potential $V_{PP}$ to the sources of all cells within the selected block. X decoder 17 couples a ground potential to all word lines of memory array 11. The bit lines of the selected block are allowed to float during the erasure operation. In this manner, block erasure is achieved.

Flash EPROM 10 also includes a redundant memory array 20. Redundant array 20 is organized into redundant blocks 27a through 27n, each associated with one of blocks BLOCK0 through BLOCKn of memory array 11. Thus, the number of redundant blocks 27a-27n corresponds to the number of blocks BLOCK-0-BLOCKn of main memory array 11. Redundant blocks 27a-27n each includes eight redundant columns of memory cells (i.e., eight redundant bit lines). Each redundant column only extends in one redundant block and is not shared by adjacent redundant blocks.

Alternatively, each of redundant blocks 27a-27n may include more or fewer than eight redundant columns. For example, each of redundant blocks 27a-27n may include sixteen redundant columns.

The redundant columns in each of redundant blocks 27a-27n can replace defective columns in the associative one of blocks BLOCK0-BLOCKn. For example, when redundant block 27a is associated with main block BLOCK0, the redundant columns in redundant block 27a each can replace one defective column found in BLOCK0. When replacing a defective column in main memory array 11, the redundant column is accessed whenever the defective column is accessed.

The redundant columns in each of redundant blocks, when activated, are accessed for the read and programming operations when their respective defective columns in the associative main block are addressed for such operations. In other words, whenever the defective columns of a block of memory array 11 are addressed for one of the read and programming operations, their redundant columns are addressed for the same operations. The erasure operation to each of redundant blocks 27a-27n can take place when its associative one of main blocks of BLOCK0-BLOCKn undergoes the erasure operation. This happens regardless whether the redundant block has activated redundant columns or not.

Flash EPROM 10 also includes redundant sense amplifiers 23 and 24. The redundant bit lines of each of redundant block 27a-27n are coupled to redundant sense amplifiers 23 and 24 via a redundant Y gating circuitry 22. The outputs of redundant sense amplifiers 23 and 24 are connected to output buffers 14 via multiplexer 13. Redundant Y gating circuitry 22 is coupled to block decoder 18 and to a comparison logic 30 via bus 35, which will be described in more detail below. Multiplexer 13 is also coupled to comparison logic 30 via bus 36, which will also be described in detail below.

The two redundant sense amplifiers 23-24 indicate that for each address applied to main memory array 11, there can be maximum of two defective columns in the addressed byte or word of bit lines being replaced with the redundant columns. This means that for each addressed byte or word of bit lines in main memory array 11, there are permitted of two defective columns being replaced with two redundant columns. When there is only one redundant sense amplifier, there can only be one defective column in each addressed byte or word of bit lines to be replaced with one redundant column. When there are three redundant sense amplifiers, there can be three defective bit lines in each addressed byte or word of bit lines to be replaced with three redundant bit lines. If there are four redundant sense amplifiers, there can be four defective bit lines for each address applied to flash EPROM 10 to be replaced.

For alternative embodiments, the number of redundant sense amplifiers 23-24 can be more or fewer than two. For example, the number of redundant sense amplifiers can be four or eight.

Referring again to FIG. 1, each of sense amplifiers 23-24 is associated with four redundant bit lines of each of redundant blocks 27a-27n. For one embodiment, sense amplifier 23 is connected via redundant Y gating circuitry 22 to odd redundant bit lines of each redundant block and sense amplifier 24 is connected via redundant Y gating circuitry 22 to even redundant bit lines of each redundant block. For another embodiment, sense amplifier 23 is connected via Y gating circuitry 22 to the first through fourth redundant bit lines in each redundant block and sense amplifier 24 is connected via Y gating circuitry 22 to the fifth through eighth redundant bit lines in each redundant block.

As can be seen from FIG. 1, the word lines of memory array 11 also extend over redundant blocks 27a-27n of redundant memory array 20. Therefore, the word lines of memory array 11 are shared by and are common to all redundant blocks 27a-27n. Similar to the arrangement of main memory array 11, the memory cells of each redundant block are formed at intersections of the word lines and the redundant bit lines. The memory cells in redundant memory array 20 have their control gates coupled to the word lines. The drains of the memory cells within one redundant block are connected to the redundant bit lines of that block. The sources of all cells within one redundant block are connected to a common source line of that redundant block.

Flash EPROM 10 also includes a second group of erasure switches 21a through 21n, each associated with one of redundant blocks 27a-27n. Each of erasure switches 21a-21n couples one of the $V_{SS}$, $VD_{DI}$, and $V_{PP}$ potentials to the sources of all cells within its respective redundant block via a common source line of that block. Each of erasure switches 21a-21n couples one of the $V_{SS}$, $V_{DI}$, and $V_{PP}$ potentials to its respective redundant block during one of read, programming, and erasure operations to redundant memory array 20. Each of erasure switches 21a-21n is associated with one of erasure switches 19a-19n. For example, when redundant block 27a is associated with main block BLOCK0, erasure switch 21a is associated with erasure switch 19a. Each of erasure switches 21a-21n may be ordinary switch that comprises a set of FET transistors.

Each of redundant blocks 27a-27n is block erased by its respective one of erasure switches 21a-21n when its associative one of main block BLOCK1-BLOCKn is block erased. This happens regardless whether the redundant columns of the redundant block are activated or not. Similar to erasure switches 19a-19n, erasure switches 21a-21n are also coupled to block decoder 18. When block decoder 18 selects one of erasure switches 19a-19n to block erase its respective block, block decoder 18 also selects the associative one of erasure switches 21a-21n to block erase the associative redundant block of that main block.

Flash EPROM 10 also includes CAM sets 32. CAM sets 32 includes eight sets of CAM cells, each CAM set acts as a storage register to store data. Each CAM set of CAM sets 32 is fourteen bits wide.

Alternatively, CAM sets 32 can comprise more or fewer than eight sets of CAM cells. For example, CAM sets 32 may comprise sixteen sets of CAM cells. In addition, each set of CAM sets 32 may be more or less than fourteen bits wide.

For the preferred embodiment, the number of CAM sets 32 corresponds to the number of the redundant columns of each of redundant blocks 27a-27n. Therefore, each of CAM sets 32 corresponds to one redundant column in each of redundant blocks 27a-27n.

Each of CAM sets 32 can access one redundant column in each of redundant blocks 27a-27n. Therefore, each of CAM sets 32 can access one redundant column in any one of redundant blocks 27a-27n. Each of CAM sets 32 accesses its associative redundant columns in all of redundant blocks 27a-27n via comparison logic 30 and Y gating circuitry 22. Each of CAM sets 32 includes (1) an address field that stores the Y address of a byte or word of bit lines that include a defective column in main memory array 11, (2) an I/O field that stores the data which indicates the bit position of the defective column in the addressed byte or word of bit lines to multiplexer 13, and (3) a tag field that stores information on whether the CAM set is used to activate one of its associative redundant column or not. Multiplexer 13 is controlled by the I/O data to use the output of the respective one of redundant sense amplifiers 23-24 that is coupled to the associative redundant column of the CAM set to replace the output of one of sense amplifiers 12 that is coupled to the selected defective column during the read operation. During the programming operation, I/O data stored in the I/O field of the CAM set controls multiplexer 13 to coupled the data bit that is destined for the defective column within the addressed bit lines to the associative redundant column of the CAM set via one of lines 39-40. The structure of CAM sets 32 will be described in more detail below, in conjunction with FIG. 3.

Each of CAM sets 32 is coupled to comparison logic 30 via bus 33. Each of CAM sets 32 can store the Y address of one byte or word of bit lines that include a defective column in main memory array 11. When one of CAM sets 32 stores the Y address of a defective column of main memory array 11, that particular one of CAM sets then activates one of its associative redundant columns in redundant array 20 to replace that defective column in main memory array 11. Which one of the associative redundant columns of that CAM set is activated depends on the block in which the defective column is located in main memory array 11. For example, if the defective column is found in BLOCK0 and redundant block 27a is associated with BLOCK0, the CAM set activates its associative redundant column in redundant block 27a to replace the defective column in BLOCK0. Each of CAM sets 32 activates its associative redundant columns via comparison logic 30 and redundant Y gating circuitry 22. Redundant Y gating circuitry 22 is also controlled by block decoder 18. Block decoder 18 controls redundant Y gating 22 to select one of redundant blocks 27a-27n every time one of blocks BLOCK0-BLOCKn is addressed. In this situation, only one redundant column is selected by one of CAM sets 32 when the CAM set stores the Y address of a defective column.

When there is no defective column found in main memory array 11, flash EPROM 10 operates as described above during the normal operations. When one of blocks BLOCK0-BLOCKn is found to have a defective column, the Y address of the defective column is programmed into the address field of one of CAM sets 32 and the I/O data of the associative one of sense amplifiers 12 of the defective column is programmed into the I/O field of that CAM set. The tag field of that CAM set is then programmed to indicate that the CAM set has been used to activate a redundant column to replace a defective column of main memory array 11.

Now assume that the defective column is found in BLOCK0 and redundant block 27a is associated with BLOCK0. This means when BLOCK0 is selected for an operation, block decoder 18 also selects the associative redundant block 27a for that operation.

During one of the read and programming operations, addresses are applied to decoders 16-18 to address a byte or word of memory cells in main memory array 11. The addresses are also applied to comparison logic 30 via bus 26. Comparison logic 30 compares the Y address of each of the addresses applied with the Y address stored in each of CAM sets 32. When an address applied at buses 25-26 selects the byte or word of bit lines in BLOCK0 that contains the defective column, comparison logic 30 indicates a match of the address applied with the address stored in one of CAM sets 32. Comparison logic 30 then access, via bus 35 and Y gating circuitry 22, the associative redundant columns of that CAM set in each of redundant blocks 27a-27n. At this time, block decoder 18 causes redundant Y gating circuitry 22 to select redundant block 27a that is associated with BLOCK0. Therefore, only the redundant column in redundant block 27a that is associated with the CAM set is activated.

When flash EPROM 10 is performing a read operation, redundant Y gating circuitry 22 couples the associative one of sense amplifiers 23-24 to the selected redundant column to read the data from the addressed memory cell of the selected redundant column. The data bit read by the associative one of sense amplifiers 23-24 is then coupled to multiplexer 13. Which one of sense amplifiers 12 is coupled to the defective column and therefore its output is to be replaced with the output of the redundant sense amplifier depends on the data stored in the I/O field of the CAM set. The data stored in the I/O filed of the CAM set indicates the bit position of the defective column in a data byte or data word addressed by the address. When the data stored in the I/O field of that CAM set indicates that the defective column has a bit position of four, for example, then multiplexer 13 substitutes the output of data the fourth sense amplifier of sense amplifiers 12 that is coupled to the defective column with the data bit read from the associative redundant sense amplifier.

When flash EPROM 10 is in the programming operation, multiplexer 13 is controlled by the I/O data via bus 36 to couple the data bit of a data that is to be programmed in a cell of the defective column to the selected redundant bit line via one of lines 39-40. When the data stored in the I/O field of that CAM set indicates that the defective column has a bit position of four (i.e., data pin $D_3$), then multiplexer 13 and redundant Y gating circuitry 22 apply the fourth data bit of the data for programming to the selected redundant column.

During block erasure operation, each of redundant blocks 27a–27n is block erased whenever its associative main block of blocks BLOCK0-BLOCKn is accessed for the block erasure operation. This is done by block decoder 18. When block decoder 18 selects one of erasure switches 19a–19n for the erasure operation, it also selects the associative one of erasure switches 21a–21n for the erasure operation.

When there are found two defective columns for one addressed byte or word of bit lines, two CAM sets are used to store the same address, the data of the bit positions of the two defective columns are stored in their respective one of the CAM sets. Every time the particular byte or word of bit lines are addressed, the two CAM sets are activated to select their respective redundant columns in the selected redundant block. The actual positions of the two defective columns are then determined by the I/O data stored in the two CAM sets, respectively.

Figure 2:
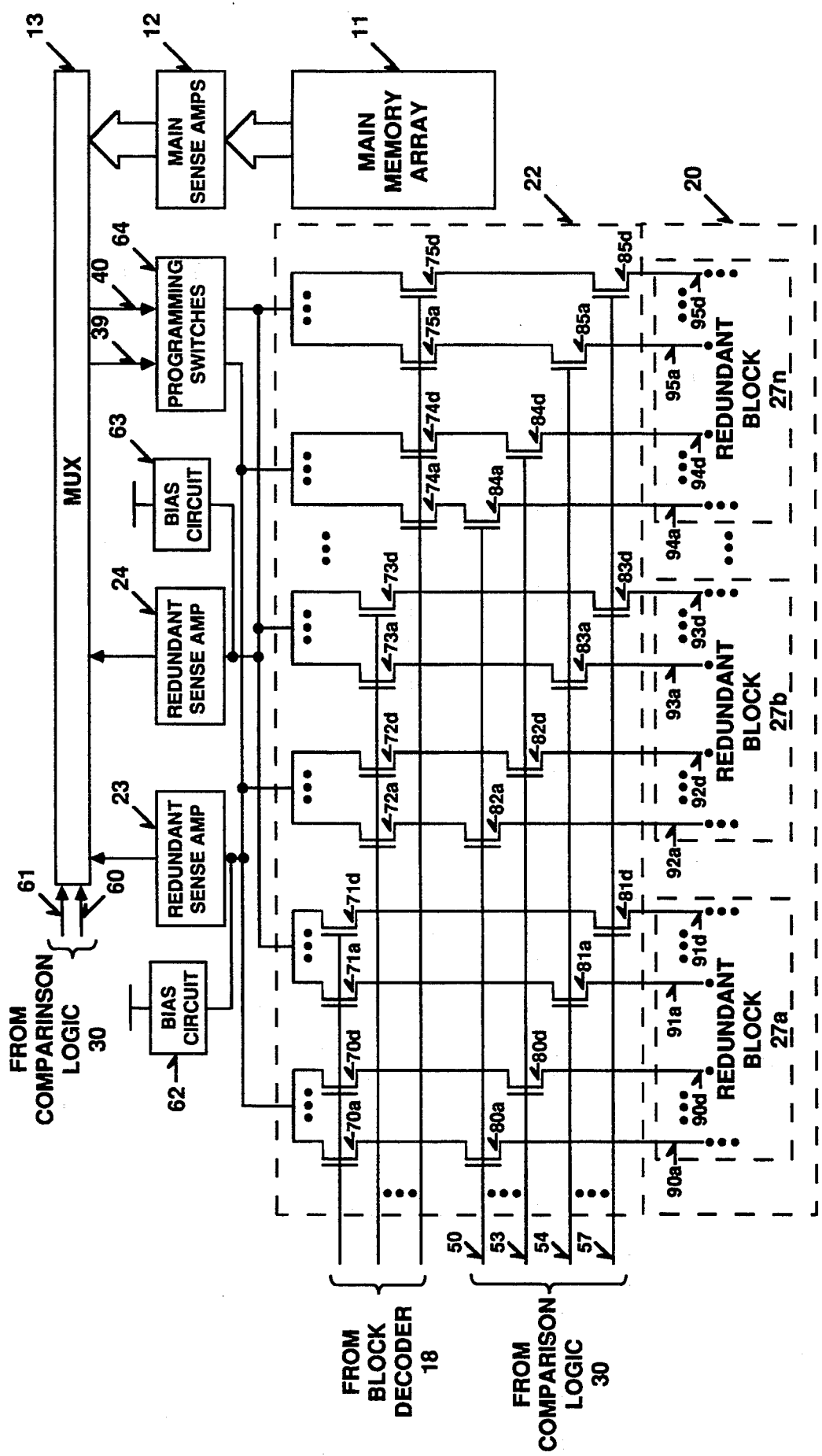
FIG. 2 illustrates the redundant Y gating circuitry for the redundant blocks of FIG. 1.

Referring to FIG. 2, redundant Y gating circuitry 22 includes block select transistors and column select transistors for each of redundant blocks 27a–27n. Transistors 70a through 70d and 71a through 71d are block select transistors of redundant block 27a. Transistors 72a through 72d and 73a through 73d are block select transistors of redundant block 27b and transistors 74a74d and 75a–75d are block select transistors of redundant block 27n. The gates of the block select transistors of redundant Y gating circuitry 22 are coupled to block decoder 18 of FIG. 1. When block decoder 18 applies a logical high voltage to the gates of block select transistors 70a–70d and 71a–71d, redundant block 27a is selected. When block decoder 18 applies a logical high voltage to the gates of block select transistors 72a–72d and 73a–73d, redundant block 27b is selected, etc.

The column select transistors of redundant Y gating circuitry 22 select the individual redundant columns within each of redundant blocks 27a–27n. Transistors 80a–80d and 81a–81d are the column select transistors of redundant block 27a and transistors 82a–82d and 83a–83d are the column select transistors of redundant block 27b. Transistors 84a–84d and 85a–85d are the column select transistors of redundant block 27n. The gates of the column select transistors for the redundant columns in redundant blocks 27a–27n that are associative with one CAM set are connected together. For example, the gates of transistors 80a, 82a, and 84a of blocks 27a–27n are connected together to line 50. The gates of column select transistors 80d, 82d, and 84d are commonly connected to line 53. Likewise, the gates of column select transistors 81d, 83d, and 85d are commonly connected to line 57. Lines 50 through 57 are connected to comparison logic 30 of FIG. 1. Each of lines 50–57 is associated with and controlled by one of CAM sets 32 of FIG. 1. The structure of CAM sets 32 and comparison logic 30 is shown in FIG. 3, which will be described in detail below.

When line 50 applies a logical high voltage to the gates of transistors 80a, 82a, and 84a, redundant columns 90a, 92a, and 94a in blocks 27a–27n are selected. When line 57 receives a logical high voltage, column select transistors 81d, 83d, and 85d select their respective redundant columns 91d, 93d, and 95d in blocks 27a–27n. Only one redundant column in all redundant blocks 27a–27n, however, can be a selected redundant column at one time for one of redundant sense amplifiers 23–24. This is due to the combination of the block select transistors and the column select transistors of redundant Y gating circuit 22.

If a defective column is found in the associative block BLOCK0 of redundant block 27a, redundant block 27a is selected whenever BLOCK0 is a selected block. Then one of CAM sets 32 of FIG. 1 activates the associative redundant column in redundant block 27a via comparison logic 30 and its column select transistor of Y gating circuitry 22. The turned-on column select transistor and block select transistor couple the selected redundant column to its respective sense amplifier or to receive programming data via one of lines 39–40.

Figure 3:
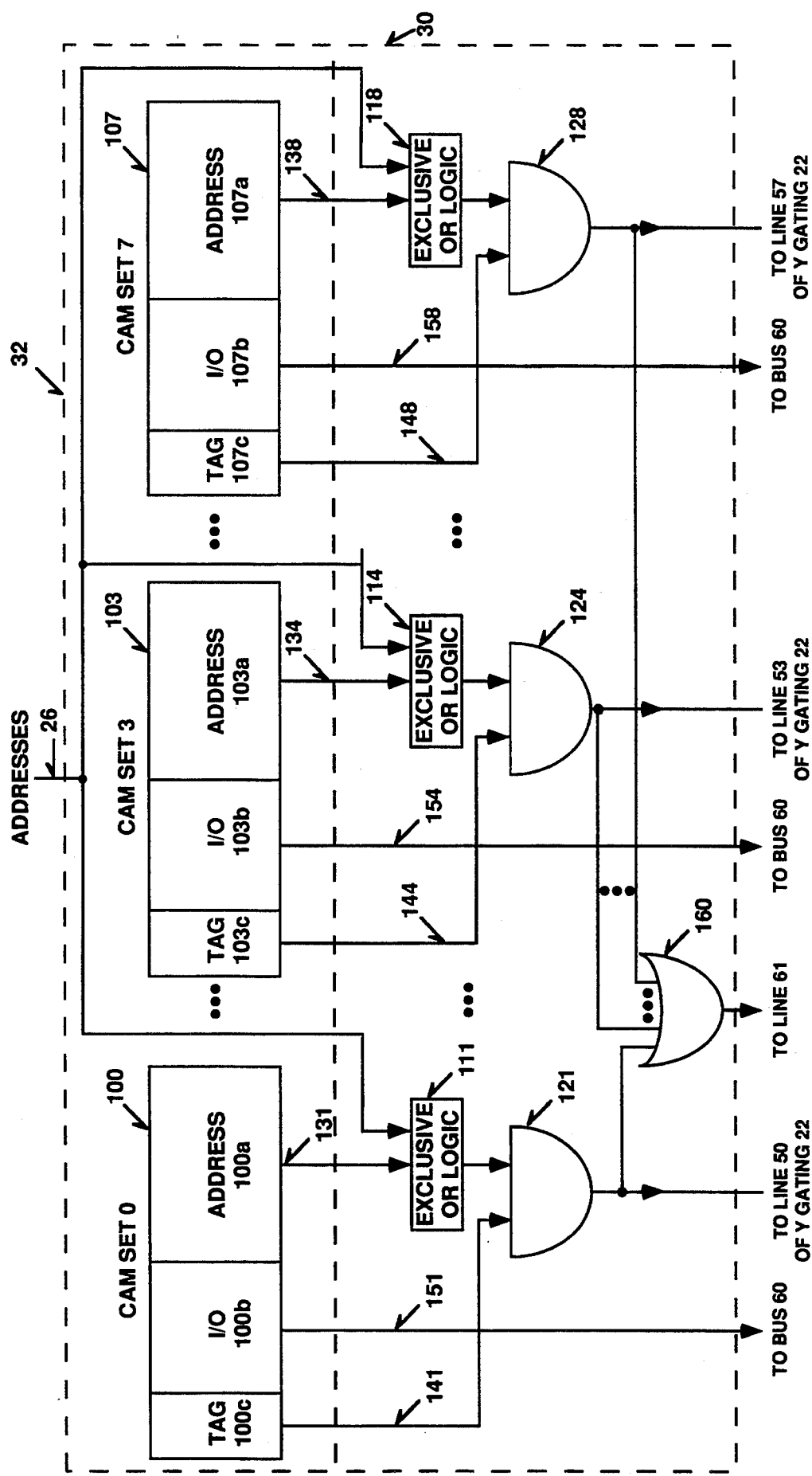
FIG. 3 is a block diagram of the CAM sets and the comparison logic of FIG. 1.

Referring to FIG. 3, CAM sets 32 includes eight CAM sets 100 through 107. Each CAM set includes an address field, an I/O field, and a tag field. For example, CAM set0 (i.e., 100) includes address field 100a, I/O field 100b, and tag field 100c. The address field of each of CAM sets 100–107 is coupled to its respective exclusive OR logic of comparison logic 30. Comparison logic 30 includes eight exclusive OR logics 111 through 118 and eight AND gates 121 through 128. Incoming addresses are applied to each of exclusive OR logics 111–118 via bus 26 to compare with the one stored in the address field of each of CAM sets 100–107. The output of each of exclusive OR logics 111–118 is then applied to its respective one of AND gates 121–128. The other input of each of AND gates 121–128 is from the tag field of its respective CAM set. The I/O field of each of CAM sets 100–107 is applied to multiplexer 13 (FIGS. 1 and 2) via bus 60. The I/O field of each of CAM sets 100–107 stores the data that indicates the bit position of the defective column in the addressed bit lines. The output of each of AND gates 121–128 is coupled to its respective one of lines 50–57 of Y gating circuitry 22 and to multiplexer 13 via OR gate 160 and line 61. The signal on line 61 to multiplexer 13 acts as a select enable signal to multiplexer 13. Bus 60 and line 61 of FIG. 2 form bus 36 of FIG. 1.

When an address is supplied to access flash EPROM 10 of FIG. 1, the incoming address is also applied to comparison logic 30 via bus 26. Bus 26 couples the incoming address to each of exclusive OR logics 111–118. Each of exclusive OR logics 111–118 then compares the incoming address with the one stored in the address field of its respective one of CAM sets 100–107. When a match occurs in one of exclusive OR logics 111–118, it applies a logical high signal to its respective one of AND gates 121–128. The logical high signal is then ANDed with the tag bit of that CAM set. As described above, the tag field of each of CAM sets 100–107 is used to indicate whether the respective CAM set is currently used to store the address of a defective column or not. If the tag bit indicates that the CAM set is not used, the respective AND gate is locked to output logical low regardless of the input from the exclusive OR logic.

For example, when CAM set3 (i.e., 103) stores an address of a defective column and exclusive OR logic 114 indicates that the incoming address matches the one stored in address field 103a of CAM set3 (i.e., 103), the output of exclusive OR logic 114 goes to logical high. AND gate 124 then performs an AND function of the output signal with the tag bit from tag field 103c of CAM set3 (i.e., 103). Because CAM set3 (i.e., 103) is in use, the tag bit is at logical high which causes AND gate 124 to output a logical high signal. The output of AND gate 124 is then applied to line 53 of redundant Y gating circuitry 22 to select the associative redundant columns of CAM set3 (i.e., 103)in redundant memory array 20. As described above, which one of the associative redundant columns is selected depends on which one of redundant blocks 27a–27n is selected. The output of AND gate 124 is also applied to multiplexer 13 via OR gate 160 and line 61 as select enable signal of multiplexer 13. The data stored in I/O field 103b of CAM set3 (i.e., 103) is then coupled to multiplexer 13 via line 154 of bus 60. The data stored in I/O field 103b indicates the bit position of the defective column in the addressed bit lines.

Alternatively, an additional bit can be added to each of CAM sets 100–107. The additional bit is used to indicate whether the defective column is in the boot block.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory device, comprising:
   (A) a main memory array for storing data, wherein the main memory array comprises:
     (1) a first block;
     (2) a second block;
   (B) a redundant memory array that comprises
     (1) a first redundant block that comprises a first redundant column of memory cells and a second redundant column of memory cells, wherein the first redundant block is associated with the first block of the main memory array and is selected when the first block is selected, wherein the first and second redundant columns of the first redundant block are used to replace defective columns of the first block;
     (2) a second redundant block that comprises a third redundant column of memory cells and a fourth redundant column of memory cells, wherein the second redundant block is associated with the second block of the main memory array and is selected when the second block is selected, wherein the third and fourth redundant columns of the second redundant block are used to replace defective columns of the second block;
   (C) a content addressable memory (CAM) that comprises
     (1) a first set of CAM cells associated with the first redundant column of the first redundant block and the third redundant column of the second redundant block for storing a first address of a first defective column in the main memory array, wherein the first set of CAM cells cause the first redundant column in the first redundant block to replace the first defective column when the first defective column is in the first block, wherein the first set of CAM cells cause the third redundant column in the second redundant block to replace the first defective column when the first defective column is in the second block;
     (2) a second set of CAM cells associated with the second redundant column of the first redundant block and the fourth redundant column of the second redundant block for storing a second address of a second defective column in the main memory array, wherein the second set of CAM cells cause the second redundant column in the first redundant block to replace the second defective column when the second defective column is in the first block, wherein the second set of CAM cells cause the fourth redundant column in the second redundant block to replace the second column when the second defective column is in the second block.

2. The nonvolatile memory device of claim 1, wherein the main memory array includes a plurality of blocks, wherein the redundant memory array includes a plurality of redundant blocks, each corresponding to one of the plurality of blocks, wherein the CAM includes a number of sets of CAM cells, wherein each of the plurality of redundant blocks includes a number of redundant columns that correspond to the number of sets of CAM cells.

3. The nonvolatile memory device of claim 1, further comprising decoding means coupled to receive an address from an external circuit for selecting (1) one of the first and second blocks for data access and (2) one of the first and second redundant blocks, wherein when the decoding means selects the first block, the decoding means activates the first redundant block, wherein when the decoding means selects the second block, the decoding means activates the second redundant block.

4. The nonvolatile memory device of claim 3, wherein the decoding means is a block decoder.

5. The nonvolatile memory device of claim 1, further comprising comparison circuitry coupled between the CAM and the redundant memory array for comparing an address received from an external circuit with the first and second addresses, wherein the comparison circuitry activates the first and third redundant columns when the address matches the first address, wherein the comparison circuitry activates the second and fourth redundant columns when the address matches the second address.

6. The nonvolatile memory device of claim 5, further comprising sensing means coupled to the first, second, third, and fourth redundant columns of the redundant memory array.

7. The nonvolatile memory device of claim 5, further comprising first sensing means coupled to the first and third redundant columns and second sensing means coupled to the second and fourth redundant columns.

8. The nonvolatile memory device of claim 7, further comprising multiplexer means coupled to the first sensing means, the second sensing means and a group of sensing circuits, wherein the group of sensing circuits are coupled to the main memory array for sensing a data addressed by the address received from the external circuit, wherein the multiplexer means is controlled by the comparison circuitry.

9. The nonvolatile memory device of claim 1, wherein the first redundant block includes eight redundant columns, including the first and second redundant columns and the second redundant block includes eight redundant columns, including the third and fourth redundant columns, wherein the CAM includes eight sets of CAM cells, including the first and second sets of CAM cells.

10. The nonvolatile memory of claim 1, wherein each of the first and second sets of CAM cells includes an address field for storing the respective one of the first and second addresses, a bit position field for storing bit position data that indicates position of the respective one of (1) the first defective column within a first group of columns in the main memory array addressed by the first address and (2) the second defective column within a second group of columns in the main memory array addressed by the second address.

11. The nonvolatile memory of claim 10, wherein each of the first and second sets of CAM cells further comprises an additional field that contains information which indicates whether the respective defective column is in a boot block of the main memory array.

12. A nonvolatile memory device comprising:
(A) a main memory array for storing data, wherein the main memory array comprises:
  (1) a first block;
  (2) a second block;
(B) a redundant memory array that comprises
  (1) a first redundant block that comprises a first redundant column of memory cells and a second redundant column of memory cells, wherein the first redundant block is associated with the first block of the main memory array and is selected when the first block is selected, wherein the first and second redundant columns of the first redundant block are used to replace defective columns of the first block;
  (2) a second redundant block that comprises a third redundant column of memory cells and a fourth redundant column of memory cells, wherein the second redundant block is associated with the second block of the main memory array and is selected when the second block is selected, wherein the third and fourth redundant columns of the second redundant block are used to replace defective columns of the second block;
(C) a content addressable memory (CAM) that comprises
  (1) a first set of CAM cells associated with the first redundant column of the first redundant block and the third redundant column of the second redundant block for storing a first address of a first defective column in the main memory array;
  (2) a second set of CAM cells associated with the second redundant column of the first redundant block and the fourth redundant column of the second redundant block for storing a second address of a second defective column in the main memory array;
(D) decoding means coupled to receive an incoming address from an external circuit for selecting (1) one of the first and second blocks for data access and (2) one of the first and second redundant blocks, wherein when the decoding means selects the first block, the decoding means selects the first redundant block, wherein when the decoding means selects the second block, the decoding means selects the second redundant block; and
(E) comparison circuitry coupled between the CAM and the redundant memory array for comparing the address with the first and second redundant addresses, wherein the comparison circuitry activates the first and third redundant columns when the address matches the first address, wherein the comparison circuitry activates the second and fourth redundant columns when the address matches the second address, wherein the first set of CAM cells, the comparison circuitry, and the decoding means cause the first redundant column in the first redundant block to replace the first defective column when the first defective column is in the first block, wherein the first set of CAM cells, the comparison circuitry, and the decoding means cause the third redundant column in the second redundant block to replace the first defective column when the first defective column is in the second block, wherein the second set of CAM cells, the comparison circuitry, and the decoding means cause the second redundant column in the first redundant block to replace the second defective column when the second defective column is in the first block, wherein the second set of CAM cells, the comparison circuitry, and the decoding means cause the fourth redundant column in the second redundant block to replace the second column when the second defective column is in the second block.

13. The nonvolatile memory device of claim 12, wherein the main memory array includes a plurality of blocks, wherein the redundant memory array includes a plurality of redundant blocks, each corresponding to one of the plurality of blocks, wherein the CAM includes a number of sets of CAM cells, wherein each of the plurality of redundant blocks includes a number of redundant columns that correspond to the number of sets of CAM cells.

14. The nonvolatile memory device of claim 12, further comprising first sensing means coupled to the first and third redundant columns and second sensing means coupled to the second and fourth redundant columns.

15. The nonvolatile memory device of claim 14, further comprising a first multiplexer coupled to the first sensing means and a first group of sensing circuits, and a second multiplexer coupled to the second sensing means and a second group of sensing circuits, wherein the first and second groups of sensing circuits are coupled to the main memory array for sensing a data addressed by the incoming address, wherein the first and second multiplexers are controlled by the comparison circuitry.

16. The nonvolatile memory device of claim 12, wherein the first redundant block includes eight redundant columns, including the first and second redundant columns and the second redundant block includes eight redundant columns, including the third and fourth columns, wherein the CAM includes eight sets of CAM cells, including the first and second sets of CAM cells.

17. The nonvolatile memory device of claim 12, wherein the decoding means is a block decoder.

18. The nonvolatile memory of claim 12, wherein each of the first and second sets of CAM cells includes an address field for storing the respective one of the first and second addresses, a bit position field for storing bit position data that indicates position of respective one of (1) the first defective column within a first group of columns in the main memory array addressed by the first address and (2) the second defective column within a second group of columns in the main memory array addressed by the second address.

19. The nonvolatile memory of claim 18, wherein each of the first and second sets of CAM cells further comprises an additional field that contains information which indicates whether the respective defective column is in a boot block of the main memory array.

* * * * *